US008426812B2

(12) United States Patent  
Bean et al.

(10) Patent No.: US 8,426,812 B2
(45) Date of Patent: Apr. 23, 2013

(54) MICROSCOPE SYSTEM, METHOD FOR OPERATING A CHARGED-PARTICLE MICROSCOPE

(75) Inventors: Stewart Bean, Cambridgeshire (GB); Roger Rowland, Cambridgeshire (GB); Simon Hees, Cambridge (GB)

(73) Assignee: Carl Zeiss Microscopy Ltd., Cambridge (GB)

( * ) Notice: Subject to any disclaimer, the term of this patent is extended or adjusted under 35 U.S.C. 154(b) by 0 days.

(21) Appl. No.: 13/287,927

(22) Filed: Nov. 2, 2011

(65) Prior Publication Data

US 2012/0104250 A1   May 3, 2012

(30) Foreign Application Priority Data

Nov. 3, 2010   (EP) .................................... 10014245

(51) Int. Cl.
*H01J 37/26* (2006.01)
*G01N 23/00* (2006.01)

(52) U.S. Cl.
USPC ........... 250/310; 250/311; 250/307; 250/306; 250/397

(58) Field of Classification Search .................. 250/310, 250/311, 307, 306, 397
See application file for complete search history.

(56) References Cited

U.S. PATENT DOCUMENTS

| 6,768,114 B2* | 7/2004 | Takagi ............................... 850/1 |
| 7,485,858 B1 | 2/2009 | Obara et al. |
| 7,705,300 B2* | 4/2010 | Morokuma et al. .......... 250/310 |
| 8,026,491 B2* | 9/2011 | Ogashiwa et al. ........ 250/396 R |
| 2003/0193026 A1 | 10/2003 | Takagi |
| 2006/0210129 A1 | 9/2006 | Trendelenburg et al. |
| 2010/0091362 A1 | 4/2010 | Isozaki et al. |

OTHER PUBLICATIONS

Communication dated Mar. 23, 2011 in European Application No. 1001425.4 (four pages).
Examined claims 1-15 in European Application No. 1001425.4 (five pages).

* cited by examiner

*Primary Examiner* — Nikita Wells
(74) *Attorney, Agent, or Firm* — Bruce D Riter

(57) ABSTRACT

A method of operating a charged-particle microscope, the method comprising: recording a first image of a first region of an object in a first setting; recording a second image of a second region of the object using the charged-particle microscope in a second setting; reading a third image of a third region using the charged-particle microscope, wherein the first and second regions are contained at least partially within the third region; displaying a representation of the first image at least partly within the displayed third image, wherein the representation of the first image includes a first indicator which is indicative of the first setting; displaying a representation of the second image at least partly within the displayed third image, wherein the representation of the second image includes a second indicator which is indicative of the second setting, and wherein the displayed second indicator is different from the displayed first indicator.

20 Claims, 8 Drawing Sheets

MICROSCOPE SYSTEM, METHOD FOR OPERATING A CHARGED-PARTICLE MICROSCOPE

CROSS-REFERENCES TO RELATED APPLICATIONS

The present application claims priority of European patent application No. 10 014 245.4, filed Nov. 3, 2010, entitled "MICROSCOPE SYSTEM, METHOD FOR OPERATING A CHARGED-PARTICLE MICROSCOPE", the content of which is hereby incorporated by reference in its entirety.

TECHNICAL FIELD

The present invention relates generally to a method of operating a charged-particle microscope or a method of operating a combination of a charged-particle microscope with another microscope of a different type. More specifically, the invention is concerned with a method of operating a charged-particle microscope for managing a plurality of images which have been acquired at different microscope settings.

BACKGROUND ART

In microscopic applications, it is typically necessary for a user to view a larger area of the object at a lower magnification in order to locate multiple small areas to be viewed. When the smaller area to be viewed is located, the user refocuses and switches the magnification. Thereby, the user typically generates a set of images of the object, which covers a range of magnifications. The user has to browse this set of images for identifying object features or for deciding at which locations of the object to acquire further images.

However, when comparing images of widely different magnifications, it is difficult to see how they are related to each other.

In the field of scanning electron microscopy, objects are often analyzed by using images of different detector configurations each of them revealing different characteristics of the object. For example, a secondary electron detector (SE detector) allows to identify topographic features of object. The resolution of the SE detector is typically 1 to 3.5 nm at an energy of the primary electron beam of 30 kV, enabling very fine details of the surface topography to be resolved.

A backscattered electron detector (BSE detector) is typically placed close to the exit opening of the electron optical system to capture electrons, which are reflected or backscattered at acute angles from the object. Since the intensity of the BSE signal is strongly related to the atomic number (Z) of the object, BSE images can provide information about the distribution of chemical elements in the sample. BSE detectors are typically solid-state devices, often with multiple components. For example, by switching of two of the four quadrants of a 4-Quadrant BSE detector, some shadowing can be created resulting in a better topographical contrast.

Moreover, scanning electron microscopes are often provided with an energy-dispersive spectrometer (EDX detector). When the primary electron beam removes an inner shell electron from an atom of the object, characteristic X-rays are emitted when higher energy electrons fill the inner shell of the atom and release energy. These characteristic X-rays are measured by the EDX detector, resulting in a spectrum which may be used to identify the elemental composition of the object and to measure the abundance of specific elements.

Therefore, a comprehensive study of an object with a scanning electron microscope may involve studying images of different magnifications which have been acquired by using different detectors from different locations on the specimen. However, it is typically difficult for the user to determine how these images are related to each other making the analysis of a complex object a time-consuming task.

Accordingly, it is considered desirable to provide a method for operating a charged-particle microscope which allows a more efficient acquisition and analysis of image data of an object.

Embodiments provide a method of operating a charged-particle microscope, wherein the method comprises: recording a first image of a first region of an object using the charged-particle microscope in a first setting; recording a second image of a second region of the object using the charged-particle microscope in a second setting, wherein the second setting differs from the first setting with respect to at least one of a kinetic energy of primary charged particles used for imaging, a detector setting used for imaging, a beam current of the charged particles used for imaging and a pressure in a measuring chamber of the charged-particle microscope; recording a third image of a third region of the object using the charged-particle microscope, wherein the first and second regions are contained at least partially within the third region; displaying at least a portion of the third image; displaying a representation of the first image at least partly within the displayed third image, wherein the representation of the first image includes a first indicator which is indicative of the first setting; displaying a representation of the second image at least partly within the displayed third image, wherein the representation of the second image includes a second indicator which is indicative of the second setting, and wherein the displayed second indicator is different from the displayed first indicator.

The method may be in particular a computer-implemented method. The charged-particle microscope may for example be an electron microscope or a helium ion microscope. The electron microscope may be a scanning electron microscope or a transmission electron microscope.

The third image may be read from a storage medium. The storage medium may be part of a computer system or a data base. Additionally or alternatively, the third image may be read via a signal line from a light microscope or from the charged-particle microscope.

The first region of the object may for example be a region of the object which is scanned by the charged-particle beam for acquiring the first image.

The first and/or second setting may be defined as a set of operational parameters of the charged-particle microscope which are specified at a time when the first image is acquired. The first and/or second setting may comprise at least one of a kinetic energy of the electron beam, a detector setting used for imaging, a beam current of the charged particles used for imaging and a pressure in a measuring chamber. The detector setting may comprise at least one of the following: a type of a detector used for acquiring the image, a number of the detectors used for acquiring the image and a value of an operational parameter of the one or more detectors used for imaging. The measuring chamber may be a vacuum chamber. The pressure may be measured at the time when the image is acquired.

The operational parameters of the one or more detectors used for imaging may for example comprise: a detector voltage, identifier of detector segments of a 4-Quadrant-BSE detector used for imaging and an arrangement of the detector with respect to an object region of the charged-particle microscope.

For example in the case of a scanning electron microscope, the detector used for acquiring the image may be one or more from a combination of the following: a secondary electron detector (SE detector), an in-lens secondary electron detector (annular SE detector), a backscattered electron detector (BSE detector) and/or an in-lens detector for detecting backscattered electrons.

At least a portion of the third image is displayed. The third image may be displayed on a display of a computer. The computer may comprise a graphical user interface which is configured to display the third image in a rendering space of a window of the graphical user interface.

A representation of the first image is displayed on the display. The representation of the first image may comprise an unfilled frame in addition to the representation of the first image, also at least a portion of the first image may be displayed. For example, in case the first image comprises a non-overlapping region with the third image, image data of the first image which correspond to the non-overlapping region may be displayed in the non-overlapping region.

The representation of the first image is displayed at least partially within the third image. In other words, the first image may be located within the third image or may comprise both an overlapping region with the third image and a non-overlapping region with the third image.

The method may comprise determining the representation of the first image such that the representation of the first image is indicative of and/or depends on a location and an extent of the first region relative to the third region.

The location of the first region relative to the third region may be expressed by a displacement vector representing a displacement of a reference point of the first region relative to a reference point of the third region. Additionally, the location of the first region relative to the third region may be expressed by angles by which the orientation of the first region relative to the third region is described. In other words, the location of the first region relative to the third region may be expressed in the same manner as the linear position and angular position of a rigid body.

The extent may be a lateral extent, which is measured perpendicular to the optical axis of the charged-particle microscope. The lateral extent may be measured by projecting the surface topography of the imaged region of the object onto the object plane of the charged-particle microscope.

The extent of the first region relative to the third region may be expressed for example by a scale factor or by a first and a second scale factors, wherein the first scale factor corresponds to a first coordinate axis and the second scale factor corresponds to a second coordinate axis, wherein the first coordinate axis is non-parallel to the second coordinate axis.

Each of the representation of the first image and the representation of the second image comprises an indicator. The indicator may be a color and/or geometry of the respective representation. An indicator, which is represented by the geometry of the representation may for example be a line pattern of the representation and/or an icon of the representation. Each of the indicators is indicative of the setting of the electron microscope at which the respective image was taken. For example, a red-colored frame may indicate that the first image has been acquired by using an SE detector, wherein a blue-colored frame may indicate that the first image has been acquired by using a BSE detector.

Each of the indicators may be determined from a group of pre-defined indicators. For example, the color "red" for the first indicator may chosen from the group of colors "red" and "blue".

The first indicator may indicate a setting of the charged-particle microscope independently from the indicating of the location and extent of the first region by the location and the form of the representation of the first image. Accordingly, the second indicator may indicate a setting of the charged-particle microscope independently from the indicating of the extent and the location of the second region by the location and the form of the representation of the second image.

The first and second indicator may indicate first and second settings independently from the extent and locations of the first and second region relative to the third region. Thereby, the first and second indicator may provide additional information about the first and second settings. This additional information may comprise a detector setting and/or a primary charged-particle beam setting.

The second indicator is different from the first indicator. For example, the second indicator may be visibly different from the first indicator.

Accordingly, a method is provided which allows to operate a charged-particle microscope in an efficient way. In particular, the method combines the information of an image with its context (i.e. the information provided by other images). Thereby, it is easier for a user to relate the features of an image to features of an object and to determine which images are necessary to conduct a comprehensive study of the object. Consequently, the method allows to conduct a thorough and comprehensive study of complex objects within a short time.

According to an embodiment, the method further comprises recording the third image using a light microscope or the charged-particle microscope.

Alternatively, the method may comprise, recording the third image using a confocal laser scanning microscope, an atomic force microscope or a scanning tunneling microscope.

According to an embodiment, the second indicator is different from the first indicator such that the difference indicates and/or is dependent on a difference of the kinetic energies of the primary charged particles of the first and the second setting and/or a difference of the detector settings of the first and the second setting.

By way of example, the first indicator may depend on the detector setting and/or the energy of the charged-particle beam of the first setting. The second indicator may depend on the detector setting and/or the energy of the charged-particle beam of the second setting.

According to a further embodiment, a form and a location of the representation of the first image is indicative of and/or dependent on an extent and a location of the first region of the object relative to the third region of the object; and a form and a location of the representation of the second image is indicative of and/or dependent on an extent and a location of the second region relative to the third region of the object.

The form and location, of the representation of the first image and the second image may be determined depending on a magnification factor of the third image. The magnification factor of the third image may be defined as a magnification of the displayed third image. In particular, a size of the representation of the first image may be determined by multiplying the extent of the first image with the magnification factor. The location of the representation of the first image relative to the third image may be determined by multiplying the location of the first region relative to the third region with the magnification factor.

According to a further embodiment, the displayed second indicator has a color different from a color of the displayed first indicator. The color of the first indicator and the color of the second indicator may be visually distinguishable.

According to a further embodiment, the displayed second indicator has a geometry different from a geometry of the displayed first indicator. The geometry of the first indicator may be visually distinguishable from the geometry of the second indicator.

For example, the geometry of the first indicator may comprise an icon. The icon may indicate the first setting. The icon may example comprise a symbol which represents the detector, which has been used when acquiring the first image. As a further example, the representation of the first image may comprise a frame. The line pattern of the frame may be determined from the group of a solid line, a dashed line and a dashed-dotted line, depending on the first setting.

According to an embodiment, the charged-particle microscope is an electron microscope and a first detector is used for imaging of the first image and a second detector is used for imagine of the second image, wherein the first detector has a higher relative sensitivity for backscattered electrons than the second detector.

For example, the first detector is a BSE detector and the second detector is an SE detector.

According to an embodiment a first kinetic energy of the primary charged particles is used for imaging of the first image and a second kinetic energy of the primary charged particles is used for imaging of the second image, wherein the first kinetic energy is greater than 1.1 times or greater than 1.5 times or greater than 2 times the second kinetic energy.

According to a further embodiment, a lateral extent of the first region of the object is greater than a lateral extent of the second region of the object; wherein the third image and the representations of the first and second images are displayed on a display medium; and wherein a lateral extent of the displayed representation of the first image on the display medium is greater than a lateral extent of the displayed representation of the second image on the display medium.

A lateral extent of the first region may for example be a diameter of the first region, an area of the first region or a length of the first region along a coordinate axis.

According to a further embodiment, an angle between a line between a center of the first region of the object and a center of the third region of the object and a line between a center of the second region of the object and a center of the third region of the object is a first angle; wherein an angle between a line between a center of the displayed representation of the first image and a center of the displayed third image and a line between a center of the representation of the second image and the center of the displayed third image is a second angle; and wherein an absolute value of a difference between the first angle and the second angle is less than 30 degrees.

The absolute value of the difference between the first angle and the second angle may be less than 10 degrees, less than 5 degrees or less than 1 degree.

Accordingly, it is possible for the user to recognize, based on the displayed representations of the first and second image, and the displayed third image the location of the first region and the second region relative to the third region. Thereby, it is possible for the user to see from the representations which portions of the object already have been imaged and which setting of the charged-particle microscope have been used for acquiring those images.

According to an embodiment, the representation of the first image includes a frame which represents and/or which depends on a lateral extent of the first region. According to an embodiment, the first representation is displayed within the third image and image data, which are enclosed by the first frame, represent the first region and image data, which are enclosed by the second frame represent the second region.

The frame may comprise lines, which are connected and arranged to define a region on the display. In other words, the frame may be an unfilled circle or an unfilled polygon, such as a rectangle. In the region enclosed by the frame, image data values of the third image are displayed in case the frame is located completely inside the third image. In case the frame has a non-overlapping region with the third image, image data of the first image may be displayed in the non-overlapping region. In case the frame is located outside of the third image, image data of the first image may be displayed inside the frame and outside the displayed third frame. A form of the frame relative to the displayed third image may correspond to an extent of the imaged region of the object relative to an extent of the third image. In particular, a size of the frame relative to a size of the displayed third image may correspond to an extent of the first region of the object relative to an extent of the third region. The size of the frame relative to the third image may be expressed by the size of the frame divided by the size of the third image. A location of the frame relative to the displayed third image may correspond to a location of the first region relative to the third region. The form and location of the frame may be determined depending on a magnification factor of the displayed third image. The magnification factor of the third image may be defined as a magnification of the displayed third image. In particular, a size of the frame may be determined by multiplying the extent or the first image with the magnification factor. The location of the frame relative to the third image may be determined by multiplying the location of the first region relative to the third region with the magnification factor.

According to an embodiment, the method further comprises selecting one of the first and second images by selecting one of the representation of the first image and representation of the second image and displaying the selected image. According to a further embodiment, the first and/or second representation is configured to be selectable. According to a further embodiment, the method further comprises displaying at least one of the first and the second image after the representation of the at least one of the first and the second image has been selected. According to a further embodiment, the method comprises displaying a list or links, which are provided by at least one of the first and second representation after the at least one of the first and second representation has been selected.

Selecting a representation may comprise selecting the representation with a pointer of a mouse.

According to an embodiment, a lateral extent of the displayed selected image on a display medium is greater than a lateral extent of the displayed representation of the respective image on the display medium.

According to an embodiment, the method further comprises: selecting a region within the displayed third image; determining a fourth region of the object based on the selected region within the displayed third image; and recording an image of the fourth region of the object using the charged-particle microscope. The charged-particle microscope may be an electron microscope.

Accordingly, it is possible for the user to identify a region of the object, where an image is to be acquired, based on the displayed third image and based on the displayed representations of the first and second image.

According to a further embodiment, a size of the fourth region of the object is at least 10 times smaller than a size of the third region of the object.

According to an embodiment, the method further comprises: recording a fifth image of a fifth region of the object using a second microscope, and displaying a representation of the fifth image at least partially within the third image, wherein the representation of the fifth image includes an indicator, which is indicative of the second microscope.

The indicator, which is indicative of the second microscope may be different, in particularly visually different, from the first indicator and the second indicator. The fifth image may be displayed at least partially within the third image. The fifth image may be recorded using the second microscope in a second setting. The indicator which is indicative of the second microscope may be further indicative of the setting of the second microscope.

The second microscope may be a light microscope. The light microscope may comprise an optical system for imaging an object region onto a detector surface of an image sensor. Alternatively, the second microscope may be a confocal laser scanning microscope, an atomic force microscope, a scanning tunneling microscope or any type of microscope known in the art.

Accordingly, there is provided a method which combines image data which are acquired by using different microscopic techniques. Thereby, it is possible for the user to conduct a thorough and efficient microscopic study of an object by combining different microscopes.

According to an embodiment, a form and a location of the representation of the first image relative to the third image corresponds to an extent and a location of the first region of the object relative to the third region of the object; and a form and a location of the representation of the second image relative to the third image corresponds to an extent and a location of the second region relative to the third region of the object.

The form of the representation of the first image may be for example a quadrilateral, wherein each of the angles of the quadrilateral is greater or less than 90 degrees. Thereby, the representation indicate that the first region is inclined with respect to the third region. According to an embodiment, the form or the indicator of the first representation indicates an angle of an imaging direction of the first image relative to an imaging direction of the third image in case the angle is greater than 0 degrees. The imaging direction may be defined as a direction parallel to the optical axis of the charged-particle microscope or the light microscope when the image is acquired. The imaging direction is expressed relative to the object's coordinate system. Thereby, it is possible for the user to identify images, which at least partially show a same object portion but which are imaged from different imaging directions. This may allow to determine features of surface topography.

The electron microscope may comprise a positioning system which is configured to rotate the object with respect to the object region of the charged-particle microscope. Thereby, the first, second and third image may correspond to different orientations of the object with respect to the object region of the charged-particle optical system.

According to a further embodiment, the displaying of the third image, the displaying of the representation of the first image and the displaying of the representation of the second image is performed depending on a pre-selectable viewing direction.

By way of example, in case the representation of the first image indicates that the first region is inclined with respect to the third region or that an imaging direction of the first region and the imaging direction of the third region form an angle greater than 0 degrees, the user may change a viewing direction such that the representation of the first image is shown as a rectangle or a square, indicating that the viewing direction is parallel to the optical axis of the charged-particle microscope at the time of acquiring the first image, or that the viewing direction is parallel to the imaging direction of the first image. Then, the first image and a representation of the third image may be displayed, wherein a form and a location of the representation of the third image indicates and/or is dependent on a location and extent of the third region relative to the first region.

According to an embodiment, the method further comprises: acquiring a spectrum and/or a diffraction pattern from an interaction region of the charged-particle beam with the object; and displaying a representation of the spectrum and/or the diffraction pattern at least partially within the third image; wherein the representation of the spectrum and/or diffraction pattern includes an indicator of the spectrum and/or diffraction pattern.

The spectrum may be for example an X-ray spectrum, a secondary ion mass spectrum or a cathodoluminescence spectrum. The diffraction pattern may for example be a pattern of diffracted backscattered electrons. The X-ray spectrum may be for example measured by an energy dispersive spectrometer (EDX spectrometer) or a wavelength dispersive spectrometer (WDS spectrometer). The pattern of diffracted backscattered electrons may be for example acquired by an electron backscattered diffraction detector (EBSD detector).

A location of the representation of the spectrum and/or diffraction pattern relative to the third image may be indicative of and/or depend on a location of the interaction region relative to the location of the third image. The representation of the spectrum and/or the diffraction pattern may be for example a mark or an unfilled frame. The representation of the spectrum and/or diffraction pattern may be selectable. The displayed indicator of the spectrum and/or diffraction pattern may be different from indicators of representations of images, thereby indicating the presence of a spectrum or a diffraction pattern. An indicator of a representation of a spectrum may be different from an indicator of a representation of a diffraction pattern. The indicator may be indicative of and depend on characteristics of the spectrum and/or diffraction pattern. For example, the indicator of a spectrum may be indicative of and/or depend on an element, which is revealed by the spectrum. Further by way of example, the indicator of a diffraction pattern may be indicative of and/or depend on a crystallographic orientation.

According to a further embodiment, the method further comprises displaying an icon at an icon location within the third image; wherein the icon is configured to provide at least one link to a data object of the icon.

The icon may be placeable by the user at a selected location within the third image, which thereby gets the location of the icon. The data necessary for defining the icon may be saved in a data file. The data object may comprise metadata. The data object may be an instance of a data type. The data type may be a primitive data type or a complex data type. The complex data type may be for example a data structure or a class. Generating the data object may comprise extracting contents of a data file and/or sending a request to a data base. By way of example, at least one of the links may provide access to the data object via a computer network. For example, the link may be a weblink. The data object may be generated by extracting contents of an application data file to which the link points. The file may contain a text, image data, video data and/or audio data. Examples for such files are: a word processor file, an audio file, a spreadsheet file, a slide presentation file, an image file, a video file and an audio file. By way of example, the data object contains measurement data taken from the object, information related to the object, information related to the measurement process, information related to the charged-particle microscope and/or information related to the light microscope. By way of example, the measurement data may be a particle microscopic image acquired with the charged-particle microscope, a spectrum and/or a diffraction pattern from an interaction region of the charged-particle beam with the object. The measurement data may further comprise data, which have been generated by applying an evaluation routine to at least one of the images. The information related to the object may comprise an object identifier or parameters of object preparation. The information related to the measurement process or the microscope system may be for example control signals for a positioning device for positioning the object, wherein the control signals are indicative, of the icon location, a magnification of the charged-particle microscope or a magnification of the light microscope. The data object may correspond to one or a combination of the following: a voice recording, a text document, a spectrum, a camera image, a video recording, an audio recording, a charged-particle microscopic image and a light microscopic image. Additionally or alternatively, the data object may be stored on a computer of the microscope system and/or on a remote computer.

The charged-particle microscope may be configured such that the icon is selectable. Selecting the icon may comprise selecting the icon with the pointer of the mouse. After having selected the icon, the graphical user interface may display a dialog box. The dialog box may be configured to display a list of the at least one link, wherein links are attachable or removable from the list of links. The dialog box may further be configured such that a link of the one or more links is activatable. Activating the link may result in displaying at least a portion of the contents of the data object. The graphical user interface may be configured such that the icon is displaceable to a different location within the same image or to a different location within a different image.

The icon may include an indicator, which is indicative of one or more of the following: a number of the at least one link of the icon, the data type of the data objects to which the link points, the contents of the data object and the file type of the file from which the data object is generated. The indicator may be a geometry and/or a color of the icon. For example, the icon may be in the form of a symbol of an audio cassette when the linked data object corresponds to a voice recording.

According to an embodiment, the method further comprises placing an icon at the icon location within the third image; and adding a link to the icon. Placing the icon at the icon location may comprise selecting an image region of the third image. Parameters defining the region may be saved as part, of the data, which defines the icon. Thereby, the data object of the icon is assigned to the selected image region.

According to a further embodiment, the method further comprises displaying the first image; and displaying the icon at a location within the first image, wherein the location within the first image corresponds to a portion of the object, which corresponds to the icon location within the third image.

Accordingly, when the first image is displayed, the icon is still displayed at a location, which corresponds to the location at which the user originally has placed the icon within the third image. Thereby, it is possible for the user to attach information to a selected location on the surface of the object, wherein the information is accessible for the user irrespective of which image data is displayed on the display. The displaying may be performed after the representation of the first image has been selected.

A data value, which indicates the time, when the data object of the icon has been generated, may be assigned to the icon. Thereby, it is possible to display the icon only in those images, which have been acquired at substantially the same time as the data object of the icon. For example, the icon may represent a comment, which has been generated substantially at the same time as a first set of images. Then, the icon may be displayed only in those images, which show a portion of the object, which corresponds to the icon location and which are part of the first set of images.

According to a further embodiment, the representation of the first image is configured to provide at least one link to a data object of the first image. According to a further embodiment, the third image is configured to provide at least one link to a data object of the third image.

The links of the representation and/or images and the data objects to which the links point may be configured in the same manner, as has been described with reference to the links and the data objects of the icons.

The representation may be configured provide a link to image data of one or more images. By way of example, the representation of the first image may provide a link to image data of the first image. The representation of the first image may also provide a link to one or more further images. Each of the images which are linked to a common representation may at least partially show a same portion of the object. The images may differ from each other, for example, in the detector setting used for acquiring the respective image. By way of example, a representation of an image may provide a link to a BSE image and a link to an SE image, wherein both images show the same portion of the object surface.

The identifier of the representation may depend on one or more of the following: the data type of the data object and the content of the data object. For example, the representation may appear in dashed lines when it provides a link to a text document.

According to an embodiment, the method further comprises: adding a further link to the at least one link. Thereby, it is possible for the user to attach further information to the representation of an image.

According to a further embodiment, one of the at least one link is activatable by selecting the representation. By way of example, after the representation has been selected, a list of the at least one link is displayed. Each of the links, which are displayed in the list of links is configured to be selectable, for example with the pointer of the mouse. By activating the link, the user may access the contents of the data object.

According to embodiments, there is provided a method of operating a user-interface of a charged-particle microscope, comprising: reading a first image of a first region of an object, wherein the first image corresponds to a first setting of the charged-particle microscope; reading a second image of a second region of an object, wherein the second image corresponds to a second setting of the charged-particle microscope, wherein the second setting differs from the first setting with respect to at least one of a kinetic energy of primary charged particles used for imaging, a detector setting used for imaging, a beam current of the primary charged particles used for imaging and a pressure in a measuring chamber of the charged-particle microscope; reading a third image of a third region of the object, wherein the first and second regions are contained, at least partially within the third region; displaying at least a portion of the third image; displaying a representation of the first image at least partially within the displayed third image, wherein the representation of the first image includes a first indicator which is indicative of the first setting; displaying a representation of the second image at least partially within the displayed third image, wherein the representation of the second image includes a second indicator which is indicative of the second setting, and wherein the displayed second indicator is different from the displayed first indicator.

These embodiments may be combined with any one of the previously described embodiments.

The user interface may be a graphical user interface of a computer. The method may be a computer-implemented method. The computer having the graphical user-interface for performing the method may be in signal connection to a microscope or may be a computer which is isolated from microscopes. The images may be read from a memory of a computer or a data base. The images may be acquired by a charged-particle microscope or a light microscope. In other words, the group consisting of the first image, the second image and the third image may be acquired by using a light microscope, a charged-particle microscope or a combination of a light microscope and a charged-particle microscope.

The first image corresponds to the first setting and the second image corresponds to the second setting. In other words, the first image is acquired using a charged-particle microscope at a first setting and the second image is acquired using a charged-particle microscope at a second setting.

According to embodiments, there is provided a charged-particle microscope configured to perform the method according to the embodiments as described above.

BRIEF DESCRIPTION OF THE DRAWINGS

The foregoing as well as other advantageous features of the invention will be more apparent from the following detailed description of exemplary embodiments of the invention with reference to the accompanying drawings. It is noted that not all possible embodiments of the present invention necessarily exhibit each and every, or any, of the advantages identified herein.

DETAILED DESCRIPTION OF EXEMPLARY EMBODIMENTS

Figure 1A:
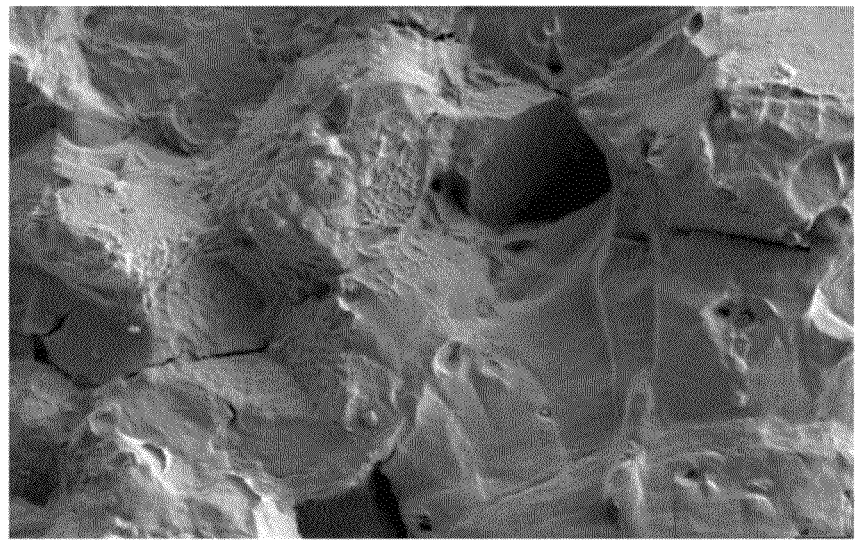
FIG. 1A shows an image of a scanning electron microscope which is acquired by using an chamber mounted SE detector.
Figure 1B:
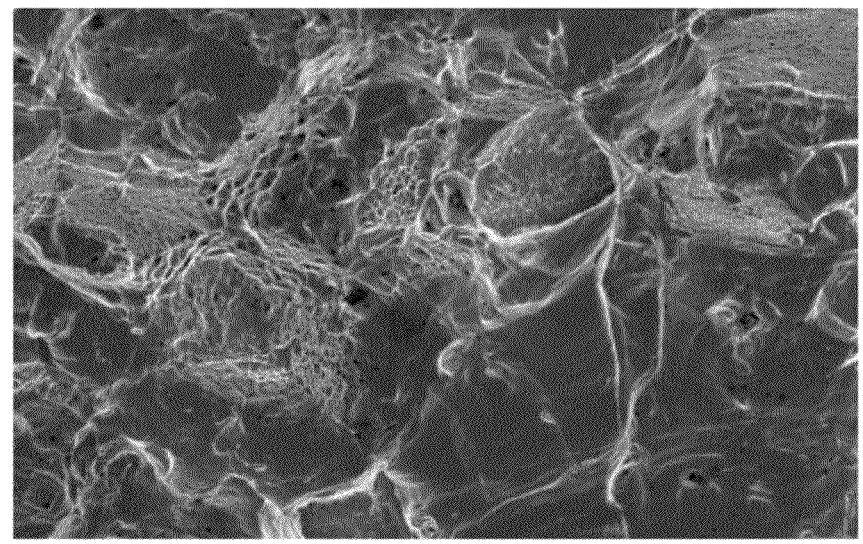
FIG. 1B shows an image of a scanning electron microscope which is acquired by using a an in-lens SE detector.

FIGS. 1A and 1B show images acquired by an electron microscope. The micrograph of FIG. 1A has been taken by using a chamber mounted SE detector. Images of a chamber mounted SE detector allow to identify large scale topographic features of object.

FIG. 1B has been acquired by using an in-lens SE detector.

While the SE image in FIG. 1A shows some topographical information on a large scale, the in-lens image shows topographic and compositional contrast and suppresses charging or edge enhancement effects.

However, comparing FIG. 1A and FIG. 1B, it is difficult to judge just by looking at the images, whether they refer to the same object and whether the imaged object region of FIG. 1A overlaps with the imaged object region shown of FIG. 1B.

This problem is in particular aggravated by the fact that images, which have been acquired from an object often cover a wide range of magnification. The magnification of a scanning electron microscope can be controlled over a comparatively wide range of up to six orders of magnitude.

Accordingly, it is considered desirable to provide a method for operating a charged-particle microscope which allows a more efficient acquisition and analysis of image data of an object.

Figure 2:
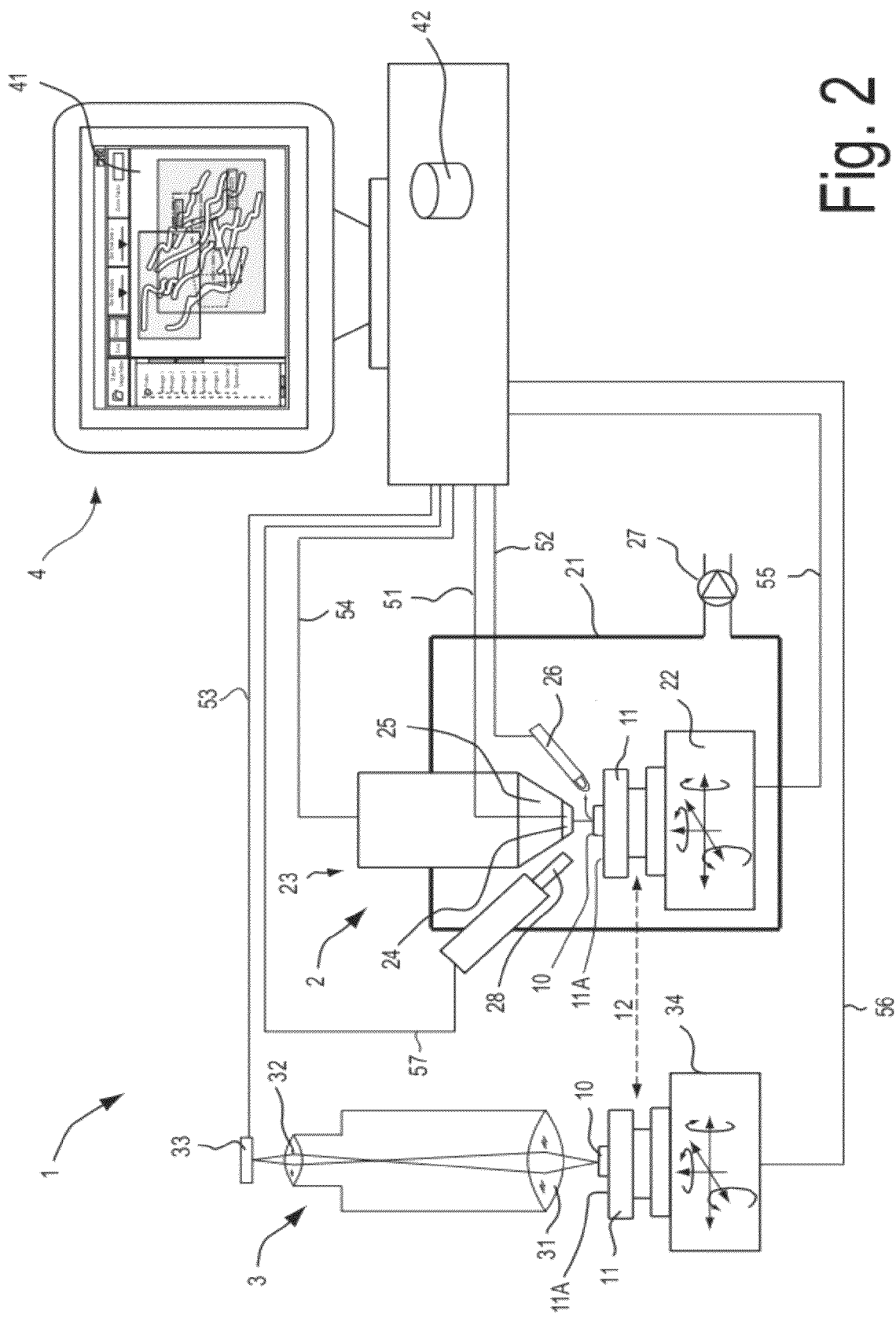
FIG. 2 is a schematic illustration of a microscope system according to an exemplary embodiment.

FIG. 2 shows a microscope system 1 according to an exemplary embodiment. The microscope system 1 comprises an electron microscope 2 and a light microscope 3. The electron microscope has an electron optical system 23 which comprises an objective lens 25. The electron optical system 23 is designed such that a beam of electrons is focusable onto an object 10, which is positioned by a positioning system 22 in an object region of the electron optical system 23. A computer 4 is in signal communication with the electron optical system 23. The computer 4 is configured to control the electron optical system 23 via signals transmitted on a signal line 54. The electron microscope 2 comprises a backscattered electron detector 24 (also denoted as BSE detector) and a secondary electron detector 26 (also denoted as SE detector). The BSE detector 24 is arranged upstream of the object region and surrounds an exit opening of the electron optical system 23. The computer 4 is in signal communication with the BSE detector via a signal line 51. The computer 4 is configured to read signals which represent image data and which are transmitted from the BSE detector via the signal line 51 to the computer 4. The computer is further configured to control via the signal line 51 settings of the BSE detector. The electron microscope 2 further comprises a secondary electron detector 26 (also denoted as SE detector). The microscopy system 1 therefore comprises two electron detectors wherein the BSE detector 24 has a higher sensitivity for backscattered electrons than the SE detector 26.

The SE detector 26 is in signal communication with the computer 4 via signal line 52. The computer 4 is configured to read signals which are transmitted from the SE detector 26 and which represent image data. The computer 4 is further configured to control via signal line 52 settings of the SE detector.

The electron microscope 2 further comprises a vacuum chamber 21 and a vacuum pumping system 27. The vacuum pumping system 27 and the vacuum chamber 21 are designed such that the vacuum chamber is evacuatable to a vacuum of between high vacuum and approximately 22 Torr, depending on the settings of the electron microscope 2.

The electron microscope 2 further comprises a positioning system 22. The positioning system 22 is designed as a six-axis stage. In other words, the object holder 11, which is mounted on the positioning system 22 and to which the object 10 is attached, is movable by the positioning system 22 with six degrees of freedom. It is also conceivable that the positioning system 22 is configured such that the object holder 11 is movable with between one and five degrees of freedom. Via signal line 55, the computer 4 transmits position control signals to the positioning system 22 to position the object 10 with respect to the object region of the electron optical system 23.

The computer 4 is further configured such that position control signals transmitted to the positioning system 22 are recorded by the computer 4. The computer 4 is configured to determine locations of regions of the object 10 which are imaged by the electron beam based on the recorded signals for controlling the position of the object 10. For example, the computer 4 may determine from the recorded position control signals a position and an orientation of a second region imaged by the electron microscope 2 relative first region imaged by the electron microscope 2.

For example, the computer 4, after having retrieved signals from the SE detector 26 or the BSE detector 24 which represent a first image, may transmit position control signals to the positioning system 22 to displace the object 50 micrometers along an x-axis. Then, the computer generates control signals for the electron optical system 23 to acquire a second image. The imaged region of the second image relative to the imaged region of the first image may then be determined to be shifted by −50 micrometers along the x-axis.

Between the acquiring of the first image and the acquiring of the second image, the computer 4 may also change a setting of the electron optical system 23. The computer 4 is configured to transmit field of view control signals via signal line 54 to the electron optical system 23 to control the field of view of the electron optical system 23. For example, the field of view of an overview image may be taken with a wider field of view and at a lower resolution than a detail image. The computer 4 is configured to record the control signals transmitted to the electron optical system 23 for setting the field of view.

Hence, the computer 4 is configured calculate based on the position control signals and the field of view control signals a relative position and orientation of two imaged regions of the object 10.

Additionally or alternatively, in case the first and second image overlap, the computer 4 may be configured to determine the field of view of the second image relative to the field of view of the first image by performing image processing routines on image data values of the first and second image. For example, the computer 4 may apply an edge detection filter for locating edges of the surface topography within the images. Thereby, it is possible to determine the imaged region of the second image with respect to the imaged region of the first image with an accuracy which corresponds to a resolution of the electron microscope 2.

The electron microscope 2 further comprises an EDX detector 28 for an energy-resolved detection of X-rays which are emitted from an interaction region where an electron beam of the electron optical system 23 interacts with the object 10.

The EDX detector 28 is in signal communication with the computer 4 via signal line 57. The computer 4 is configured to receive signals representing EDX spectra and to generate files containing the data of spectra. However, it is also conceivable that a further computer which is separate from the computer 4 is in signal communication with the EDX via signal line 57. The computer 4 is further configured to record positioning signals which are generated by the computer 4 and transmitted via signal line 55 to the positioning system 22. The computer is further configured to determine a working distance of the electron optical system 23 from operation parameters of the particle optical system 23. The computer 4 is configured to calculate depending on values of the operation parameters of the particle optical system 23 and from the recorded positioning signals transmitted to the positioning system 22 the location of the interaction region with respect to the imaged region of the third image. Additionally or alternatively to the EDX detector, the electron microscope 3 may comprise at least one of a wavelength dispersive spectrometer (WDS spectrometer), an electron backscattered diffraction detector (EBSD detector) or any other spectrometers for charged-particles or emitted light known in the art.

The microscope system 1 further comprises a light microscope 3. The light microscope 3, the electron microscope 2 and the sample holder 11 may be designed such that the sample holder 11 is transferable between the light microscope 3 and the electron microscope 2. In FIG. 2, this is indicated by arrow 12. The light microscope 3 further comprises a positioning system 34. The positioning system 34 of the light microscope 3 is designed such that the object 10 which is attached to the object holder 11 is positionable relative to an object region of an optical system of the light microscope 3. The optical system of the light microscope 3 comprises an objective lens 31 and an imaging lens system 32. The optical system of the light microscope 3 is designed such that the object region of the optical system of the light microscope 3 is imaged onto an image sensor 33 of the light microscope 3. The computer 4 is configured to receive signals of the image sensor 33 via signal line 53 and to generate image data from the received signals.

As an alternative to the computer 4, it is also conceivable that a first computer is in signal communication with the positioning system 34 of the light microscope 3 via signal line 56 and in signal communication with the image sensor 33 via signal line 53; and second computer is in signal communication with the positioning system 22 of the electron microscope via signal line 55 and with the electron optical system 23 via signal line 54. The first and the second computer may be separate (i.e. they do not share common components). It is also conceivable that each of the first computer and the second computer comprise network interfaces for data communication over a common data network. The first computer and the second computer may be in data communication with a data base, which is configured to store images, which have been acquired by the electron microscope 2 or the light microscope 3.

The computer 4 comprises a display 41. The computer 4 further comprises a graphical user interface that resides within a machine-readable media 42 to direct the operation of the computer 4 and based on the position control signals of the positioning systems 22 and 34.

The sample holder 11 may comprise marks on an upper surface 11A of the sample holder 11. The marks are imageable by the light microscope 3 and by the electron microscope 2. For example, the marks may be designed such that they are reflective for light of wavelengths which are used for imaging in the light microscope 3. The marks may further comprise a topography or a chemical composition which is imageable by the electron microscope 2. The computer 4 is configured such that the marks are detectable in images of the light microscope 3 and images of the electron microscope 2. The computer 4 is further configured to determine the location and extent of an imaged region of an image acquired by the electron microscope 2 relative to the imaged region of at image acquired by the light microscope 3 based on the detected marks in the images.

Figure 3:
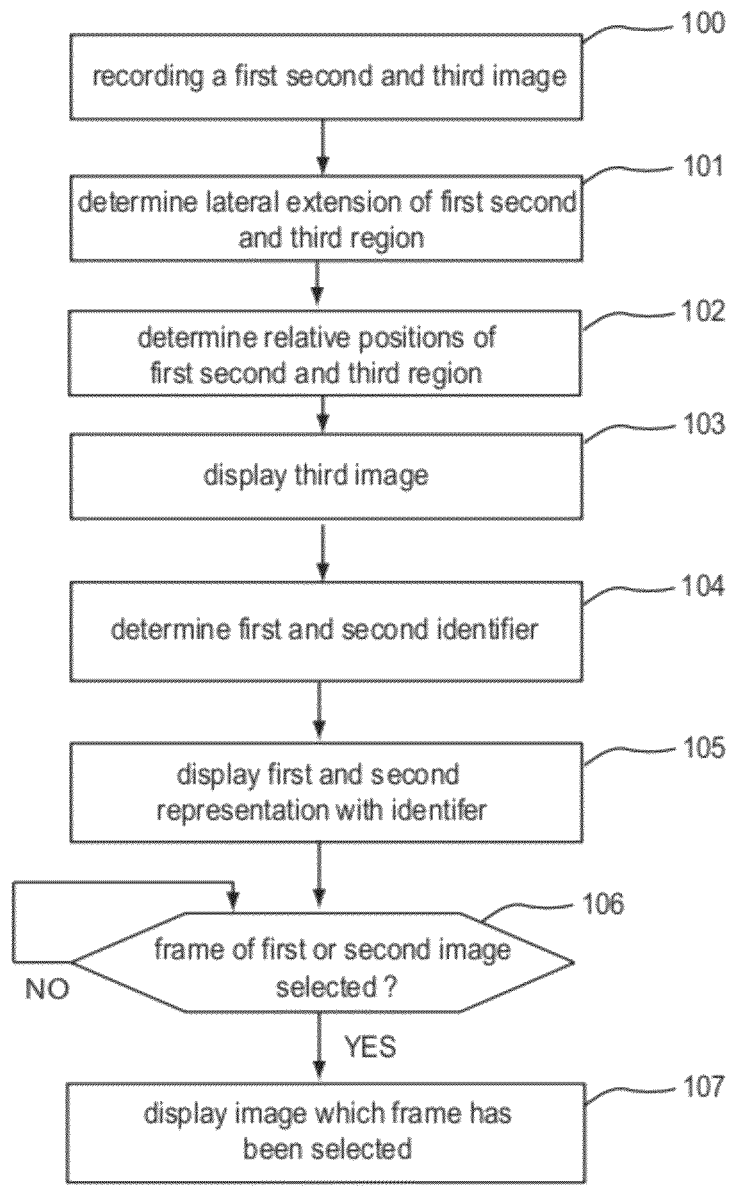
FIG. 3 is a flow-chart illustrating a method according to an exemplary embodiment.

FIG. 3 is a flowchart which illustrates an exemplary embodiment. The embodiment is described with reference to the microscope system 1, which is illustrated in FIG. 2. A first, second and a third image are recorded 100 by using the electron microscope 2 or the light microscope 3. Each of the images is generated by imaging a respective region of the object. For example, an image is acquired by the electron microscope 2 by scanning the region of the surface of the object with an electron beam of the electron optical system 23. An image acquired by the light microscope 3 is acquired by imaging a region of the object onto the image sensor 33. The computer 4 is configured to determine 101 from settings of the electron microscope 2 and/or from settings of the light microscope 3 the lateral extent of each of the regions of the first, second and third image. The determined lateral extent may be a relative extent between the first, second and third image. A lateral extent of the region may be for example a diameter, an area or a length along a coordinate axis.

The computer 4 is further configured to determine 102 a location and an extent of each of the first and the second regions relative to the third region. The computer 4 displays 103 the third image on a display 41 of the computer 4. Representations of the first and second image are displayed on the display 41 by displaying a frame, wherein a form of the frame relative to the displayed third image corresponds to an extent of the imaged region of the object relative to an extent of the third region.

The computer 4 is further configured to determine 104 a first identifier for the representation of the first image and a second identifier for the representation of the second image. Then, the representations of the first and second image are displayed 105 with their identifiers. For example, the representation of the first image may be displayed on the display 41 having a red-colored frame, indicating that the first image was acquired by using the SE detector 26 of the electron microscope 2. Correspondingly, the representation of the second image may be displayed on the display 41 having a blue-colored frame, indicating that the image was acquired by no the BSE detector 24 of the electron microscope 2.

Each of the representation of the first image and the representation of the second image are configured to be selectable. In other words, the computer 4 is configured such that the representation is selectable by an input from the user. For example, the computer 4 may stay 106 in a waiting loop until the frame of the first and/or second image is selected with the pointer of the mouse.

The computer 4 is further configured to display 107 the first image on the display 41 upon selection of the representation of the first image. Accordingly, upon selection of the representation of the second image, the second image is displayed on the display 41.

Figure 4A:
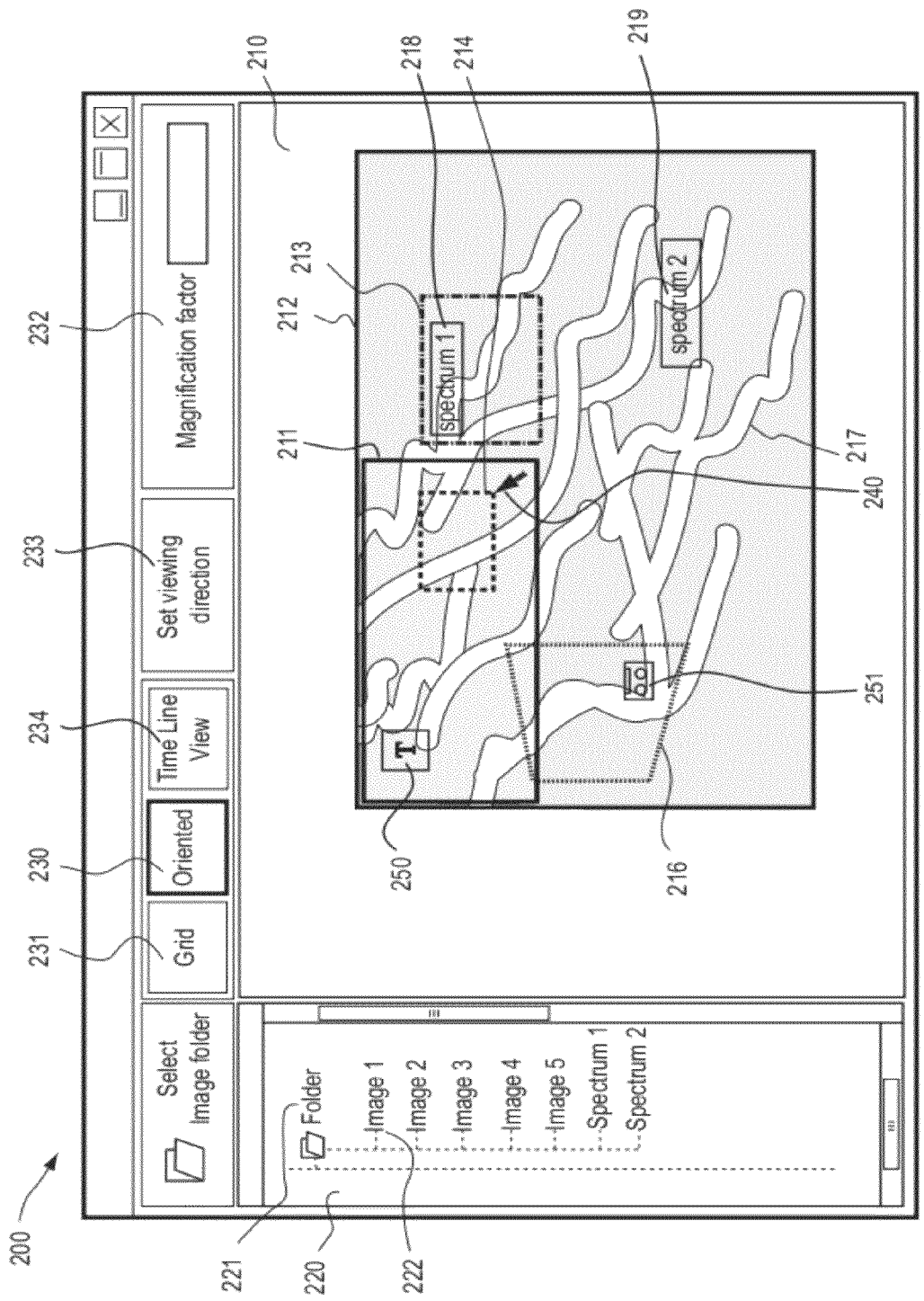
FIG. 4A is a schematic illustration of a graphical user interface in the "oriented view" mode according to an exemplary embodiment.

FIG. 4A shows a graphical user interface 200, which is displayed on the computer display 41 according to an exemplary embodiment. The graphical user interface 200 as displayed in FIG. 4A is described with reference to the microscope system 1 as displayed in FIG. 2. The graphical user interface 200 comprises a rendering space 210. The rendering space 210 is configured for rendering images which have been generated using the electron microscope 2 and the light microscope 3 of the microscope system 1. The graphical user interface 200 further comprises a directory tree view 220. The directory tree view 220 is configured to display directories 221 and file names 222 in a hierarchical list. The computer 4 may configured such that upon selection of a directory 221 in the directory tree view 220, the image files 222 contained in the selected directory 221 are selected to be a group of images, wherein each image of the group of images is displayed as an image or as a representation in the rendering space 210. The graphical user interface 200 further comprises a command bar, which comprises a button for selecting a grid view 231, a button for selecting an oriented view 230, a button for selecting a time line view 234. Thereby, the graphical user interface is configured to be switchable between an oriented view mode, a grid view mode and a time line view mode of the graphical user interface 200. The command bar further comprises an input field 232 for inputting a magnification factor. FIG. 4A shows the graphical user interface 200 in the oriented view mode.

Upon selection of the directory 221 in the directory tree view 220, the computer 4 determines a third image 212 from the images in the directory 221. The third image 212 is displayed in the rendering space 210 of the graphical user interface 200. The third image 212 may be determined for example by determining the image with the widest field of view of the images in the directory 221. The third image 212 shows object features 217. Furthermore, a representation 211 of a first image from the selected group of images is displayed in the rendering space 210. The representation 211 of the first image comprises a frame. The frame of the representation 211 of the first image comprises a first indicator, which is a solid line pattern, indicating that the image has been acquired by using the SE-detector 26 of the electron microscope 2.

The computer may also be configured to display concurrently with the image data of the third image a representation of the third image. Accordingly, in FIG. 4A, the third image 212 is provided with a frame which also comprises continuous lines, indicating that the image has been acquired by using the SE detector 26 of the electron microscope 2.

The computer 4 is further configured to display a representation 213 of a second image of the selected group of images. The representation 213 of the second image comprises a second indicator which is a dashed-and-dotted line pattern, indicating that the second image has been acquired by using the BSE detector 24.

The computer 4 is further configured such that upon selection of a region of interest 214 with a pointer 240 of a mouse of the computer 4, the computer 4 identifies image data values which correspond to the selected region of interest 214 from all images of the selected group of images in the directory 221.

Accordingly, it is possible for the user to directly compare portions of images, which correspond to a common region of the object, wherein the common region has been selected with the region of interest. Thereby, it is easier for the user to identify object features which appear in images of different microscope settings.

The computer is further configured that upon selection of a region of interest 240 by the user, an object region is defined, where a fourth image is taken by the electron microscope.

In the graphical user interface 200, also a representation of a fifth image 216 is shown. The representation of the fifth image 216 comprises a quadrilateral having our angles of greater or less than 90°. Thereby, the representation of the fifth image 216 indicates that the fifth image corresponds to an imaged region of the object which is inclined with respect to the imaged regions of the third image 212, and/or that an imaging direction of the fifth image and the imaging direction of the first image form an angle of greater than 0 degrees.

The computer 4 is further configured to display a representation of a first spectrum 218 and a representation of a second spectrum 219. The first and second spectrum have been acquired by using the EDX detector 28 of the electron microscope 2. The representation of the first spectrum 218 comprises a frame. The frame indicates the location of the interaction region where the electron beam has interacted with the object and from which the X-rays have been emitted. The representation of the first spectrum 218 further comprises an identifier, which comprises a name "spectrum 1" of the first spectrum. The graphical user interface 200 is further configured that the representation of the first spectrum 218 is selectable. When the representation of the first spectrum 218 is selected (e.g. by using the pointer of the mouse), the spectrum is displayed in the rendering space 210.

The computer 4 is further configured such that icons 250, 251 are placeable at locations within the third image 212. Each of the icons provides at least one link to a data object. For example, a first icon 250 provides a link to a data object, which contains text of a comment. The text is stored in a file on the machine-readable media 42 (shown in FIG. 2). When the user selects the icon with the pointer of the mouse, the graphical user interface 200 displays a dialog box, allowing the user to activate the link. After having activated the link, the computer 4 starts a word processing application and opens the text file with the word processing application. A second icon 251 provides a link to a data object, which contains a voice recording. When the user activates the link of the second icon 251, the computer starts an application, which plays the voice recording.

The computer 4 is further configured such that one or more links to data objects can be added to each of the representations of the images and/or spectra. Each of the links points to a data object of a data type. The data object may for example contain data, which refer to the setting of the charged-particle microscope, when the respective image has been acquired. The data may comprise one or a combination of the following: a kinetic energy of the primary charged particles used for imaging, a detector setting used for imaging, a beam current of the primary charged particles used for imaging and a pressure of the measuring chamber. Additionally or alternatively, the data object may contain data, which refer to the object, such as a stage of object preparation and/or parameters for object preparation. Activating the link may comprise selecting the representation of the respective image or spectrum (for example with the pointer of the mouse). Thereby, the data object is accessible to the user.

The first icon 250 is placed within the representation of the first image 211. By selecting the representation of the first image 211, image data of the first image are displayed on the display. Furthermore, also the fist icon 250 is displayed at a location within the first image, which corresponds to the location at which the first icon 250 is placed within the third image 212.

Accordingly, the icons allow the user to access information, which is relevant for a specific location on the object surface, irrespective of which image data of the images in the selected group of images of the directory 221 are shown in the rendering space 210.

Figure 4B:
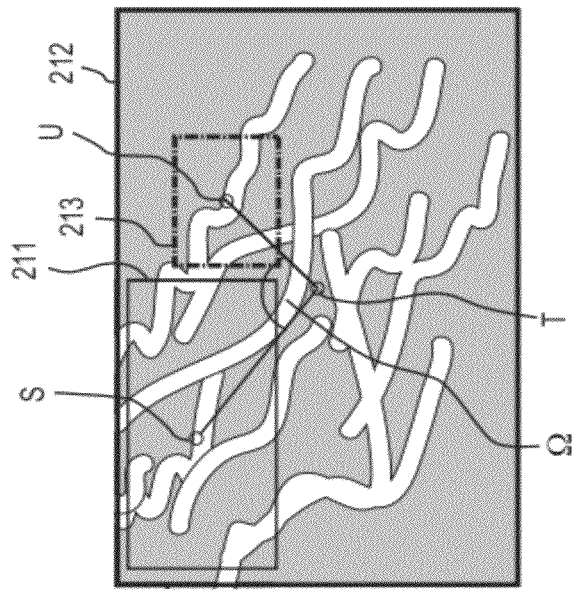
FIG. 4B is an illustration of the correspondence between imaged regions of the object and the images and representations shown in the graphical user interface according to the exemplary embodiment shown in FIG. 4A.
Figure 4B:
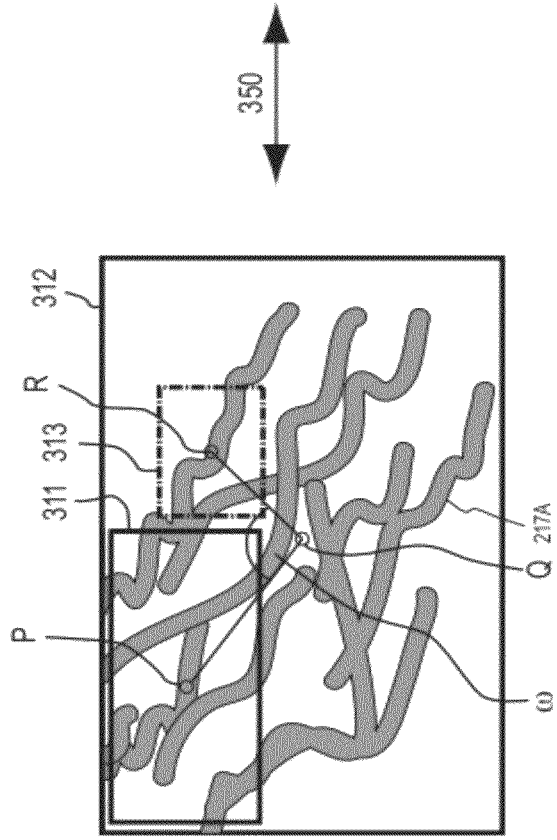

FIG. 4B schematically illustrates how imaged regions of the object correspond to images and representations of images shown in the graphical user interface 200, which has been described with reference to FIG. 4A. FIG. 4B shows object features 217A which are located on a surface of the object and which are imaged by the electron microscope 2. The objects 217A are imaged with a first field of view defining a first region 311 of the object for acquiring the first image. Then, by controlling the positioning system 22, the object is moved laterally with respect to the optical axis such that a center of the field of view of the microscope is shifted from point P to point Q on the object. Furthermore, the lateral width of the field of view is widened. At the new position, the third image is acquired by scanning the third region 312. Then, by controlling the positioning system 22, the object is again moved laterally such that the center of the field of view is shifted from point Q to point R and the lateral width of the field of view is narrowed. Then, the second image is acquired by scanning a second region 313.

The third image 212 and representations of the first image 211 and the second image 213 are displayed by the graphical user interface 200 shown in FIG. 4A. The location and form of the representation of the first image 211 relative to the third image 212 is determined such that it depends on and/or is indicative of the relative locator and extent of the first region 311 relative to the third region 312. Accordingly, the location and form of the representation of the second image 213 relative to the third image 212 is determined such that it depends on and/or is indicative of the relative location and extent of the second region 313 relative to the third region 312. This is indicated in FIG. 4B by double arrow 350.

A first line between a center of the first region 311 and the center of the third region 312 and a second line between the center of the second region 313 and the center of the third region 312 form an angle ω. A third line between the center of the third image 212 and the center of the first image 211 and a fourth line between the center of the third image 232 and the center of the second image 213 form an angle Ω. An absolute difference between ω and Ω amounts to less than 30 degrees. Thereby, the relative locations of the first image 211 and second image 213 compared to the third image 212 is indicative of the relative locations of the first region 311 and the second region 313 compared to the third region 312.

Figure 5:
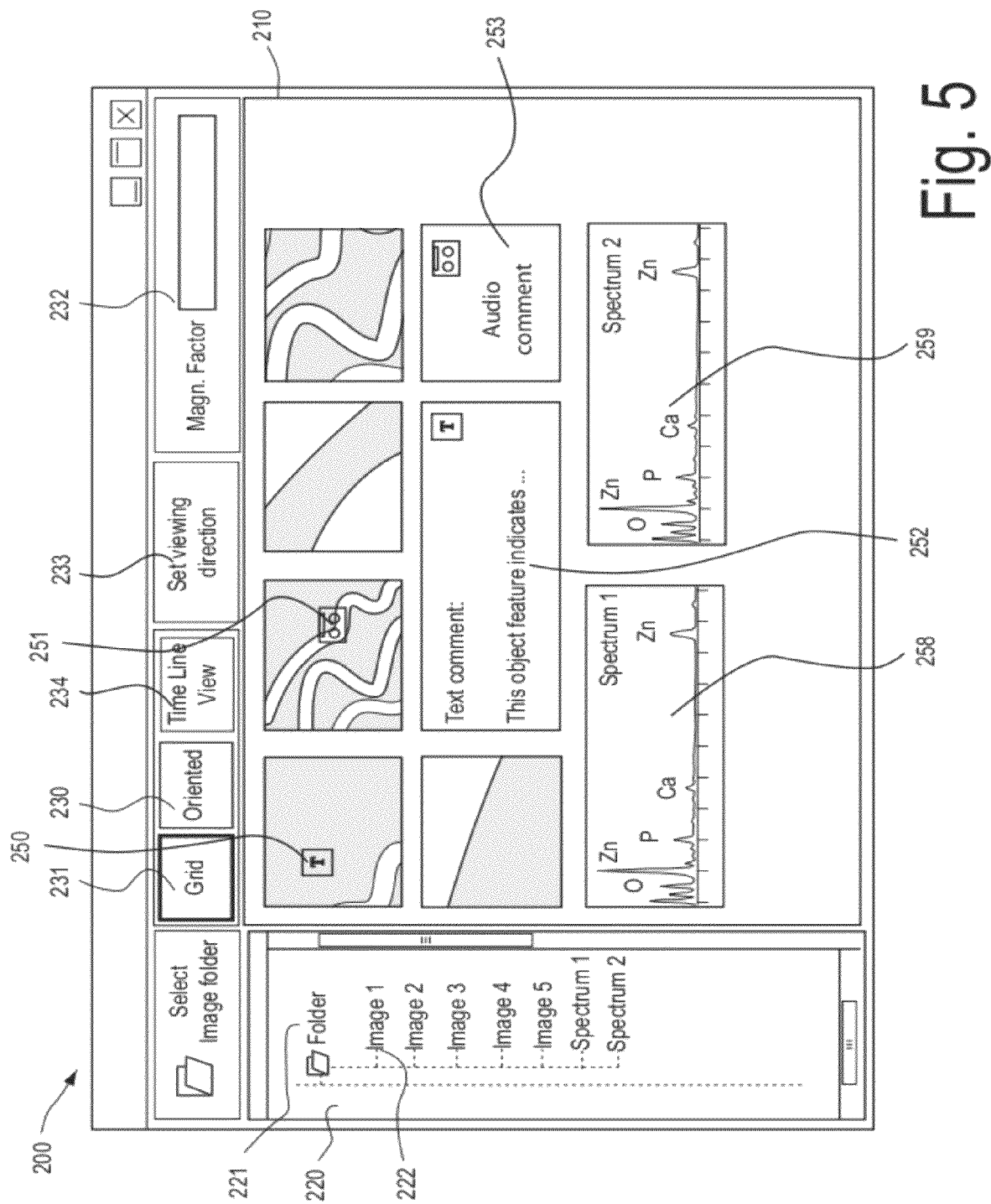
FIG. 5 is a schematic illustration of the graphical user interface shown in FIG. 4A in the "grid view" mode.

FIG. 5 illustrates the graphical user interface 200 as described with reference to FIG. 4a when the user has selected the grid view mode, for example by selecting the grid button 231 in the command bar of the graphical user interface 200 with the pointer 240 of the mouse. As shown in FIG. 5, all images in the selected directory 221 are displayed in the rendering space 210 side-by-side. In the grid view mode, also the first spectrum 258 and the second spectrum 259 are displayed side-by-side with the images.

Furthermore, for each of the data objects, to which the links of the icons 250, 251 point, a representation of the data object or at least a portion of the contents of the data object is displayed. For example, a text 252, to which the link of the icon 250 (shown in FIG. 4A) points, is at least partially displayed. Furthermore, a link button 253 is displayed for accessing the audio file to which the link of the icon 251 (shown in FIG. 4A) points. Accordingly, all the information, which is displayed to the user in the oriented view mode by way of representations and icons, is now presented to the user simultaneously. In each of the images, which are shown in the grid view mode, the icons 250, 251 are displayed when a region of the respective image shows an object portion, which corresponds to the location, at which the icon is placed within the third image 212, as shown in FIG. 4A. Thereby, it is also possible to access the data objects, to which the links of the icons point, by selecting the icons displayed within the images shown in the grid view mode.

Figure 6:
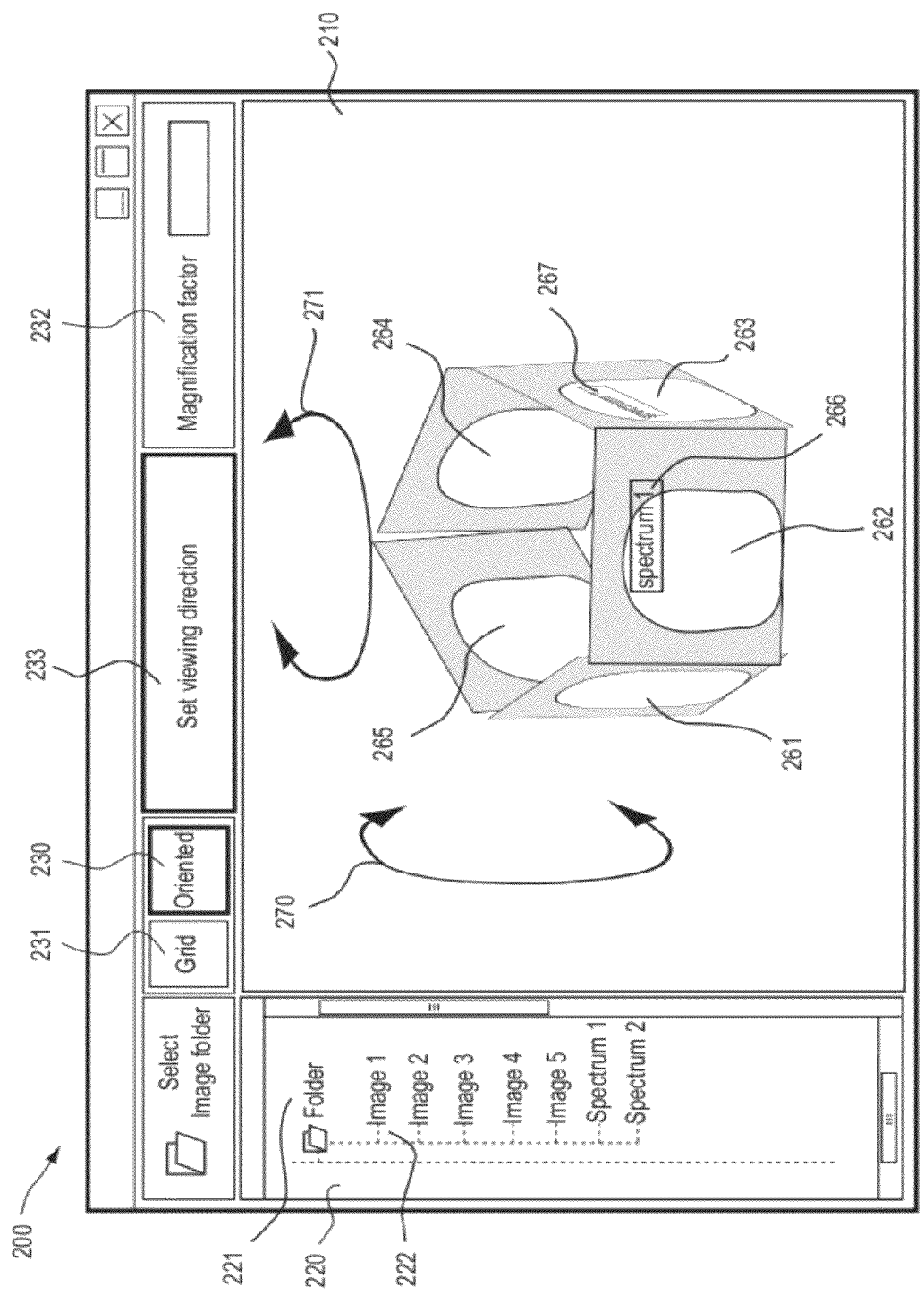
FIG. 6 is a schematic illustration of the graphical user interface shown in FIG. 4A in the "select viewing direction" mode.

FIG. 6 shows the graphical user interface, as described with reference to FIG. 4a when the "set viewing direction" button 233 is selected with the pointer of the mouse. The images displayed in FIG. 6 have been imaged with the microscope of FIG. 2, wherein in the electron microscope 2, the object 10 has been rotated with respect to the object region of the electron optical system 23 by using the positioning system 22.

As shown in FIG. 6, the image 262 is displayed in the rendering space 210 of the graphical user interface 200. Furthermore, representations of a first, second, fourth and fifth image 261, 263, 264, 265 are displayed. The representations of each of these images comprises a frame, wherein the location and the form of each of the frames indicates a location and an extent of the respective imaged region relative to the imaged region of the third image 262. In addition to the representations, also image data of the first, second, fourth and fifth image 261, 263, 264, 265 are displayed within the respective representations.

Furthermore, representations of a first spectrum 266 and a second spectrum 267 are displayed in the rendering space 210. A location of the representation of the first spectrum 266 relative to the third image 262 depends on a location of the interaction region of the first spectrum relative to the imaged region of the third image. A location or the representation of the second spectrum 267 depends on a location of the interaction region of the second spectrum relative to the imaged region of the second image.

When the user has selected the "set viewing direction" button 233 of the command bar, it is possible for the user to change the viewing direction, for example, by moving the mouse or by using arrow keys of the keyboard. The selectable viewing direction is indicated by arrows 271 and 270 in FIG. 6.

Figure 7:
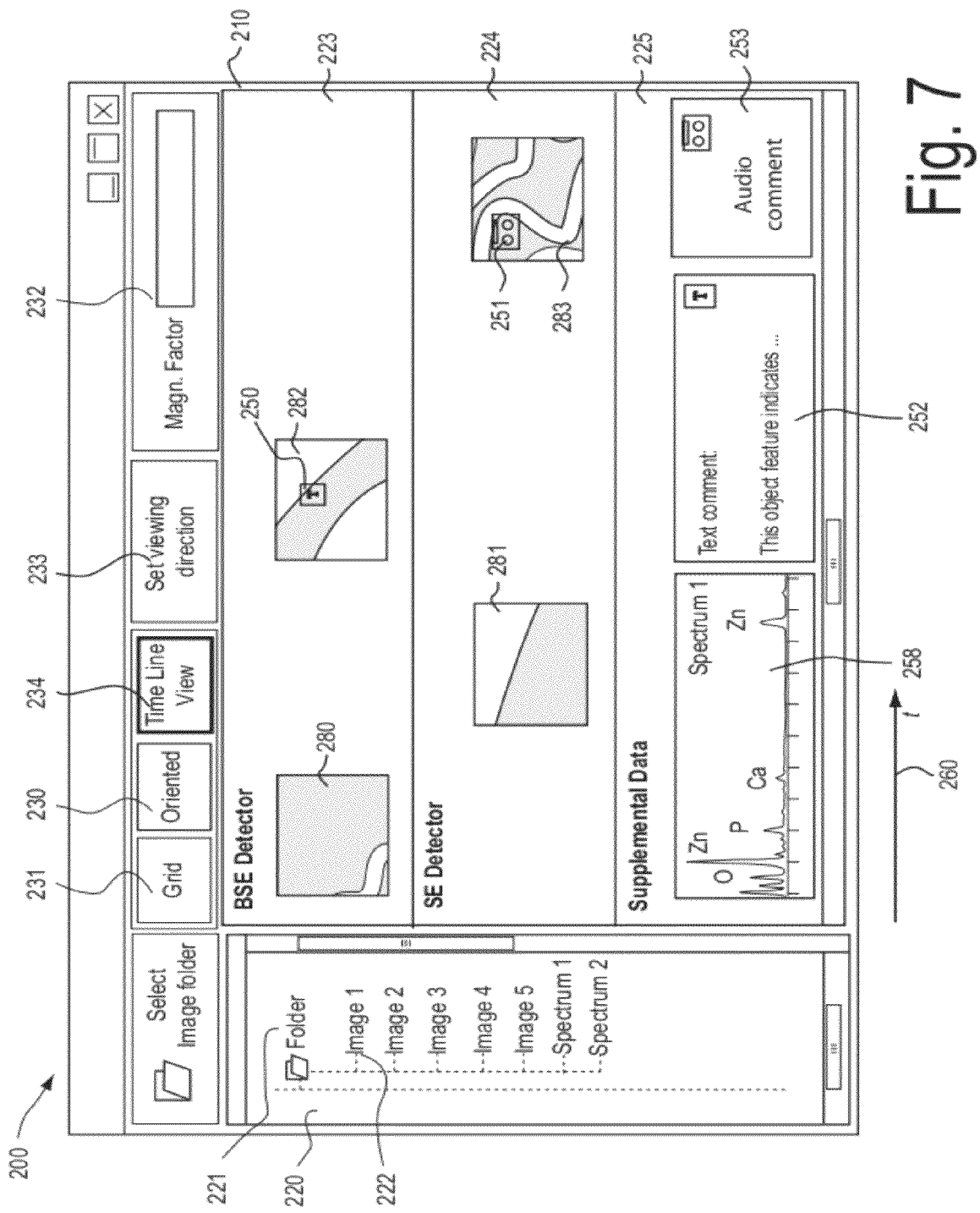
FIG. 7 is a schematic illustration of the graphical user interface shown in FIG. 4A in the "time line view mode".

FIG. 7 shows the graphical user interface, as described with reference to FIG. 4A, when the user has selected the time line mode, for example by selecting the "time line" button 234 in the command bar with the pointer of the mouse.

In the time line mode, each of the images, spectras and data objects are displayed arranged in a time-ordered manner with respect to the time of their generation. In other words, for any two objects (i.e. images, spectras and data objects), the object, which is arranged at a more leftward position has been generated at an earlier time. Thereby, a horizontal axis within the graphical user interface 200 represents a coordinate axis of time. This is schematically illustrated by arrow 260.

Accordingly, the time line mode allows the user to get an overview on how the images, spectras and data objects are related to each other with respect to their time of generation.

Furthermore, the images are arranged in the rendering space 210 depending on the detector settings, which has been used for acquiring the images. As illustrated in FIG. 7, images 280 and 282 are displayed in a first portion 223 of the rendering space 210 for displaying images, which have been acquired by using the backscattered electron detector (BSE detector). Images 281 and 283 are displayed in a second portion 224 of the rendering space 210 for displaying images, which have been acquired by using the secondary electron detector (SE detector). For all other images, spectras and for data objects, which are linked to the representations, images or icons, there is provided a third portion 225 of the rendering space 210. As shown in FIG. 7, the first spectrum 258, the text 252 and the link button 253 for accessing the audio file are displayed in the third portion 225 of the rendering space 210.

Also in the time line view, the icons (such as the first icon 250 and the second icon 251) may be displayed at locations in the images, which correspond to the location at which the icon is placed in the third image 212 (shown in FIG. 4A). Thereby, also in the time line view, the data objects, which are linked to the icons, are accessible by selecting the icons which are displayed in the images.

The invention claimed is:

1. A method of operating a charged-particle microscope, the method comprising:
   recording a first image of a first region of an object using the charged-particle microscope in a first setting;
   recording a second image of a second region of the object using the charged-particle microscope in a second setting, wherein the second setting differs from the first setting with respect to at least one of a kinetic energy of primary charged particles used for imaging, a detector setting used for the imaging, a beam current of the primary charged particles used for the imaging, and a pressure in a measuring chamber of the charged-particle microscope;
   reading a third image of a third region of the object, wherein the first and second regions are contained at least partially within the third region;
   displaying at least a portion of the third image;
   displaying a representation of the first image at least partially within the displayed third image, wherein the representation of the first image includes a first indicator which is indicative of the first setting; and
   displaying a representation of the second image at least partially within the displayed third image, wherein the representation of the second image includes a second indicator which is indicative of the second setting;
   and wherein the displayed second indicator is different from the displayed first indicator.

2. The method of claim 1, further comprising: recording the third image using a light microscope or the charged-particle microscope.

3. The method of claim 1, wherein at least one of the following holds:
   the displayed second indicator has a color different from a color of the displayed first indicator; and
   the displayed second indicator has a geometry different from a geometry of the displayed first indicator.

4. The method of claim 1, wherein the charged-particle microscope is an electron microscope and a first detector is used for imaging of the first image and a second detector is used for imaging of the second image, wherein the first detector has a higher relative sensitivity for backscattered electrons than the second detector.

5. The method of claim 1, wherein a lateral extent of the first region of the object is greater than a lateral extent of the second region of the object;
   wherein the third image and the representations of the first and second images are displayed on a display medium; and
   wherein a lateral extent of the displayed representation of the first image on the display medium is greater than a lateral extent of the displayed representation of the second image on the display medium.

6. The method of claim 1, wherein an angle between a line between a center of the first region of the object and a center of the third region of the object and a line between a center of the second region of the object and a center of the third region of the object is a first angle;
   wherein an angle between a line between a center of the displayed representation of the first image and a center of the displayed third image and a line between a center of the representation of the second image and the center of the displayed third image is a second angle; and
   wherein an absolute value of a difference between the first angle and the second angle is less than 30°.

7. The method of claim 1, wherein the representation of the first image includes a frame representing a lateral extent of the first region.

8. The method of claim 1, further comprising:
   selecting one of the first and second images by selecting one of the representation of the first image and the representation of the second image; and
   displaying the selected image.

9. The method according to claim 8, wherein a lateral extent of the displayed selected image on a display medium is greater than a lateral extent of the displayed representation of the respective image on the display medium.

10. The method of claim 1, further comprising:
    selecting a region within the displayed third image;
    determining a fourth region of the object based on the selected region within the displayed third image; and
    recording an image of the fourth region of the object using an electron microscope as the charged-particle microscope.

11. The method of claim 1, further comprising:
    recording a fifth image of a fifth region of the object using a second microscope; and displaying a representation of the fifth image at least partially within the third image, wherein the representation of the fifth image includes an indicator, which is indicative of the second microscope.

12. The method of claim 1, wherein a form and a location of the representation of the first image relative to the third image corresponds to an extent and a location of the first region of the object relative to the third region of the object; and wherein a location and form of the representation of the second image relative to the third image corresponds to a location and extent of the second region relative to the third region of the object.

13. The method of claim 1, further comprising:

acquiring at least one of a spectrum and a diffraction pattern from an interaction region of a charged-particle beam of the charged-particle microscope with the object; and displaying at least one of a representation of the spectrum and a representation of the diffraction pattern at least partially within the third image;

wherein the at least one of the representation of the spectrum and the representation of the diffraction pattern includes an indicator of the at least one of the spectrum and the diffraction pattern.

14. A microscope system comprising a charged-particle microscope, wherein the microscope system is configured to perform the method according to claim 1.

15. The microscope system of claim 14, further comprising a light microscope;

wherein the microscope system is further configured to record the third image using the light microscope or the charged-particle microscope.

16. The microscope system of claim 14, wherein at least one of the following holds:

the displayed second indicator has a color different from a color of the displayed first indicator; and the displayed second indicator has a geometry different from a geometry of the displayed first indicator.

17. The microscope system of claim 14, wherein the charged-particle microscope is an electron microscope and wherein the charged-particle microscope further comprises a first detector and a second detector;

wherein the first detector is used for imaging of the first image and the second detector is used for imaging of the second image; and wherein the first detector has a higher relative sensitivity for backscattered electrons than the second detector.

18. The microscope system of claim 14, wherein the representation of the first image includes a frame representing a lateral extent of the first region.

19. The microscope system of claim 14, wherein the microscope system is further configured to acquire at least one of a spectrum and a diffraction pattern from an interaction region of a charged-particle beam of the charged-particle microscope with the object; and to display at least one of a representation of the spectrum and a representation of the diffraction pattern at least partially within the third image;

wherein the at least one of the representation of the spectrum and the representation of the diffraction pattern includes an indicator of the at least one of the spectrum and the diffraction pattern.

20. A method of operating a user-interface of a charged-particle microscope, comprising:

reading a first image of a first region of an object, wherein the first image corresponds to a first setting of the charged-particle microscope;

reading a second image of a second region of the object, wherein the second image corresponds to a second setting of the charged-particle microscope;

wherein the second setting differs from the first setting with respect to at least one of a kinetic energy of primary charged particles used for imaging, a detector setting used for the imaging, a beam current of the primary charged particles used for the imaging, and a pressure in a measuring chamber of the charged-particle microscope;

reading a third image of a third region of the object, wherein the first and second regions are contained at least partially within the third region;

displaying at least a portion of the third image;

displaying a representation of the first image at least partially within the displayed third image, wherein the representation of the first image includes a first indicator which is indicative of the first setting;

displaying a representation of the second image at least partially within the displayed third image; wherein the representation of the second image includes a second indicator which is indicative of the second setting; and wherein the displayed second indicator is different from the displayed first indicator.

* * * * *

UNITED STATES PATENT AND TRADEMARK OFFICE
CERTIFICATE OF CORRECTION

| | | |
|---|---|---|
| PATENT NO. | : 8,426,812 B2 | Page 1 of 1 |
| APPLICATION NO. | : 13/287927 | |
| DATED | : April 23, 2013 | |
| INVENTOR(S) | : Stewart Bean et al. | |

It is certified that error appears in the above-identified patent and that said Letters Patent is hereby corrected as shown below:

In the Specification

Column 5, line 6, "may example" should read --may for example--

Column 6, line 25, "or" should read --of--

Column 6, line 40, "or" should read --of--

Column 8, line 36, "and" should read --and/or--

Column 12, line 17, "microscope" should read --microscope 2--

Column 15, line 25, "no" should read --using--

Column 16, line 42, "our" should read --four--

Column 18, line 10, "232" should read --212--

Signed and Sealed this
Twenty-third Day of July, 2013

Teresa Stanek Rea
*Acting Director of the United States Patent and Trademark Office*